United States Patent
Fang (10) Patent No.: US 9,024,408 B2
(45) Date of Patent: May 5, 2015

(54) DOUBLE SIDE WAFER PROCESS, METHOD AND DEVICE

(75) Inventor: Ming Fang, Plano, TX (US)

(73) Assignee: STMicroelectronics, Inc., Coppell, TX (US)

( * ) Notice: Subject to any disclaimer, the term of this patent is extended or adjusted under 35 U.S.C. 154(b) by 814 days.

(21) Appl. No.: 12/981,383

(22) Filed: Dec. 29, 2010

(65) Prior Publication Data

US 2012/0168896 A1    Jul. 5, 2012

(51) Int. Cl.
*H01L 27/24* (2006.01)
*B41J 2/16* (2006.01)
*B81C 1/00* (2006.01)
*G01P 15/00* (2006.01)

(52) U.S. Cl.
CPC ............ *H01L 27/24* (2013.01); *B41J 2/1601* (2013.01); *B41J 2/1607* (2013.01); *B41J 2/1626* (2013.01); *B41J 2/1631* (2013.01); *B41J 2/1632* (2013.01); *B41J 2/1635* (2013.01); *B41J 2/1639* (2013.01); *B41J 2/1643* (2013.01); *B81C 1/00246* (2013.01); *G01P 15/00* (2013.01)

(58) Field of Classification Search
CPC .... H01L 27/24; B81C 1/00246; B41J 2/1631; B41J 2/1643; B41J 2/1607; B41J 2/1635; B41J 2/1626; B41J 2/1601; B41J 2/1632; B41J 2/1639
USPC .......... 257/195, 200, 201, 499, 506, E27.013, 257/E27.014, E27.018, E27.004, E27.027, 257/E27.029; 438/460
See application file for complete search history.

(56) References Cited

U.S. PATENT DOCUMENTS

| | | | |
|---|---|---|---|
| 5,614,442 A * | 3/1997 | Tserng ........................ | 438/122 |
| 6,100,595 A * | 8/2000 | Jaouen et al. ................ | 257/778 |
| 7,203,393 B2 * | 4/2007 | Rajan et al. .................... | 385/18 |
| 7,919,814 B2 * | 4/2011 | Goto et al. .................... | 257/350 |
| 2004/0104454 A1 * | 6/2004 | Takaoka et al. ............... | 257/621 |
| 2006/0067607 A1 * | 3/2006 | Fang et al. ..................... | 385/14 |
| 2006/0113598 A1 * | 6/2006 | Chen et al. .................... | 257/347 |
| 2008/0017946 A1 | 1/2008 | Cazaux et al. | |

* cited by examiner

*Primary Examiner* — Ermias Woldegeorgis
(74) *Attorney, Agent, or Firm* — Seed IP Law Group PLLC (57) ABSTRACT

A method of manufacturing double-sided semiconductor die by performing a first plurality of processes to a first side of a wafer and performing a second plurality of processes to a second side of the wafer, thereby forming at least a first semiconductor device on the first side of the wafer and at least a second semiconductor device on the second side of the wafer. The wafer may be cut to form a plurality of die having at least one semiconductor device on each side.

21 Claims, 6 Drawing Sheets

DOUBLE SIDE WAFER PROCESS, METHOD AND DEVICE

BACKGROUND

1. Technical Field

The present disclosure pertains to semiconductor and integrated circuit devices, including micro-fabricated structures such as Micro-Electromechanical Systems (MEMS) and Nano-Electromechanical Systems (NEMS) such as BioMEMS, RFMEMS, OPTO-MEMS, etc.

2. Description of the Related Art

Electronic circuits, which are fabricated on semiconductor substrates, perform a variety of functions. Some examples are electronic circuits formed as amplifiers, filters, MEMS device, power supplies, etc. In some cases, many circuits are formed on a single semiconductor substrate to provide a multitude of functions. The end product of the fabrication is commonly called a semiconductor "chip" or integrated circuit.

The electronic circuits are often constructed on a semiconductor substrate. The substrate may initially be a single wafer, and after several electronic circuits are formed, the wafer is cut into many individual semiconductor chips. Later, each chip may be packaged in its own plastic or other suitable housing for use in an electronic system.

In order to maximize return on investment, manufacturers of semiconductor chips try to maximize the number of operational chips that can be formed on a single wafer. The number of operational chips that can be formed on the wafer may be affected by several factors. Using current technology, the semiconductor wafer may have a diameter of 6 inches, 8 inches, 12 inches or some other suitable size. In addition to the diameter of the wafer, the number of individual chips that can be formed from a single wafer may be limited by the type, size, complexity, and function of the electronic circuits that are fabricated.

Current integrated circuit and semiconductor device trends focus on obtaining higher integration levels through smaller feature sizes. For example, following what is referred to as Moore's law, it is often presumed that due to miniaturization, the number of transistors that can be practically placed on an area of, for example, a wafer, doubles approximately every two years. While planning and design of devices based on the assumptions of Moore's law has some advantages and Moore's law has, at least for the past few decades, proven to be reliable, reduction of the size of the dimensions of components, such as transistors, often requires new equipment. The processing of wafers to produce integrated circuit chips occurs in a number of different steps. The steps are often carried out in different etch chambers, others are carried out in furnaces, while others of which are deposition or implantation chambers. Capital costs of several tens of million dollars each are not unusual for these types of equipment, such as wafer-processing equipment, chambers, etc.

BRIEF SUMMARY

In an embodiment, a method comprises: forming a first plurality of semiconductor devices on a first side of a wafer; forming a second plurality of semiconductor devices on a second side of the wafer opposite of the first side of the wafer; and separating the wafer into a plurality of die, each die having at least one of the first plurality of semiconductor devices on a first side of the die and at least one of the second plurality of semiconductor devices on a second side of the die, opposite of the first side of the die. In an embodiment, the forming the first plurality of semiconductor devices and the forming the second plurality of semiconductor devices comprises performing at least one process simultaneously on the first and second sides of the wafer. In an embodiment, the forming the first plurality of semiconductor devices and the forming the second plurality of semiconductor devices comprises performing at least one process on the first side of the wafer. In an embodiment, the method further comprises performing at least one process on the second side of the wafer to compensate for the at least one process performed on the first side of the wafer. In an embodiment, performing the at least one process on the second side of the wafer comprises applying a protective layer to the second side of the wafer before performing the at least one process on the first side of the wafer. In an embodiment, performing the at least one process on the second side of the wafer comprises etching the second side of the wafer after performing the at least one process on the first side of the wafer. In an embodiment, performing the at least one process on the second side of the wafer comprises securing the second side of the wafer to a plate before performing the at least one process on the first side of the wafer. In an embodiment, forming the first plurality of semiconductor devices comprises forming a plurality of integrated circuits and forming the second plurality of semiconductor devices comprises forming a plurality of micro-electromechanical devices. In an embodiment, the method further comprises electrically coupling an integrated circuit of the plurality of integrated circuits on the first side of a die of the plurality of die to a micro-electromechanical device on the second side of the die of the plurality of die. In an embodiment, forming the first plurality of semiconductor devices comprises forming a plurality of integrated circuits and forming the second plurality of semiconductor devices comprises forming a plurality of optical devices. In an embodiment, the plurality of optical devices comprise a plurality of optical switches coupled to respective integrated circuits on the plurality of die.

In an embodiment, a semiconductor die comprises: a substrate having a first side and a second side opposite of the first side; a first semiconductor device formed on the first side of the substrate; and a second semiconductor device formed on the second side of the substrate. In an embodiment, the first semiconductor device comprises a first dielectric layer formed on the first side of the substrate. In an embodiment, the second semiconductor device comprises a second dielectric layer formed on the second side of the substrate. In an embodiment, the first semiconductor device comprises an integrated circuit and the second semiconductor device comprises a micro-electromechanical device electrically coupled to the integrated circuit. In an embodiment, the first semiconductor device comprises an integrated circuit and the second semiconductor device comprises an optical device electrically coupled to the integrated circuit. In an embodiment, the first semiconductor device comprises a first integrated circuit and the second semiconductor device comprises a second integrated circuit. In an embodiment, the first integrated circuit is electrically coupled to the second integrated circuit. In an embodiment, the first semiconductor device is an integrated circuit and the second semiconductor device is a fiber optic interface.

In an embodiment, a system comprises: a circuit board; and a semiconductor die electrically coupled to the circuit board and including: a substrate having a first side and a second side opposite of the first side; a first semiconductor device formed on the first side of the substrate; and a second semiconductor device formed on the second side of the substrate. In an embodiment, the first semiconductor device comprises an integrated circuit and the second semiconductor device comprises a micro-electromechanical device electrically coupled to the integrated circuit. In an embodiment, the first semiconductor device comprises an integrated circuit and the second semiconductor device comprises an optical device electrically coupled to the integrated circuit. In an embodiment, the first semiconductor device comprises a first integrated circuit and the second semiconductor device comprises a second integrated circuit.

In an embodiment, a method comprises: forming at least a first semiconductor device on a first side of a wafer and at least a second semiconductor device on a second side of the wafer, opposite of the first side of the wafer, by: performing a first plurality of processes to the first side of the wafer; and performing a second plurality of processes to the second side of the wafer. In an embodiment, performing the first plurality of processes and performing the second plurality of processes includes performing at least one process simultaneously to both sides of the wafer. In an embodiment, the first plurality of processes includes at least one high-temperature process. In an embodiment, the second plurality of processes is limited to low-temperature processes. In an embodiment, the second plurality of processes includes at least one process to compensate for a process of the first plurality of processes. In an embodiment, the at least a first semiconductor device comprises an integrated circuit and the at least a second semiconductor device comprises a micro-electromechanical device. In an embodiment, the first plurality of processes includes at least one process selected from the group comprising: growing material; depositing material; removing material; cleaning; drying; and cutting. In an embodiment, the first plurality of processes includes at least one plating process. In an embodiment, the method further comprises separating the wafer into a plurality of die.

DETAILED DESCRIPTION

In the following description, certain details are set forth in order to provide a thorough understanding of various embodiments of devices, methods and articles. However, one of skill in the art will understand that other embodiments may be practiced without these details. In other instances, well-known structures and methods associated with, for example, substrates, micro-fabricated structures, wafers, MEMS, NEMS, and fabrication processes, such as salicide processes, alloy deposition processes, thermal treatment processes, etching, annealing, film deposition and removal, processors, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to."

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure or the claims.

The sizes and relative positions of elements in the drawings are not necessarily drawn to scale. For example, the shapes of various elements and angles are not drawn to scale, and some of these elements may be enlarged and positioned to improve drawing legibility. Further, the particular shapes of the elements as drawn are not necessarily intended to convey any information regarding the actual shape of particular elements, and have been selected solely for ease of recognition in the drawings. Geometric references are not intended to refer to ideal embodiments. For example, a feature or element described or shown as rectilinear does not mean that a feature or element has a geometrically perfect rectilinear shape. It is further noted that shapes may appear and may be different from different perspectives.

Figure 1:
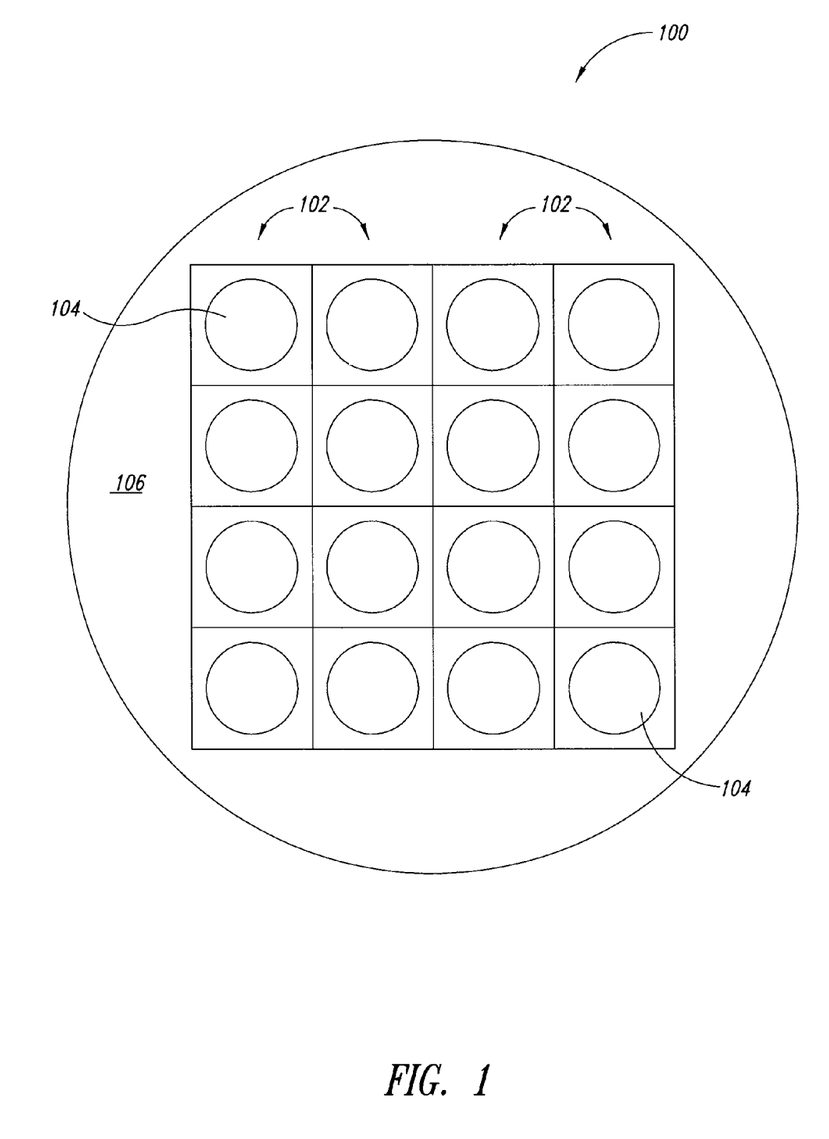
FIG. 1 is a top view of an embodiment of a wafer.
Figure 2:
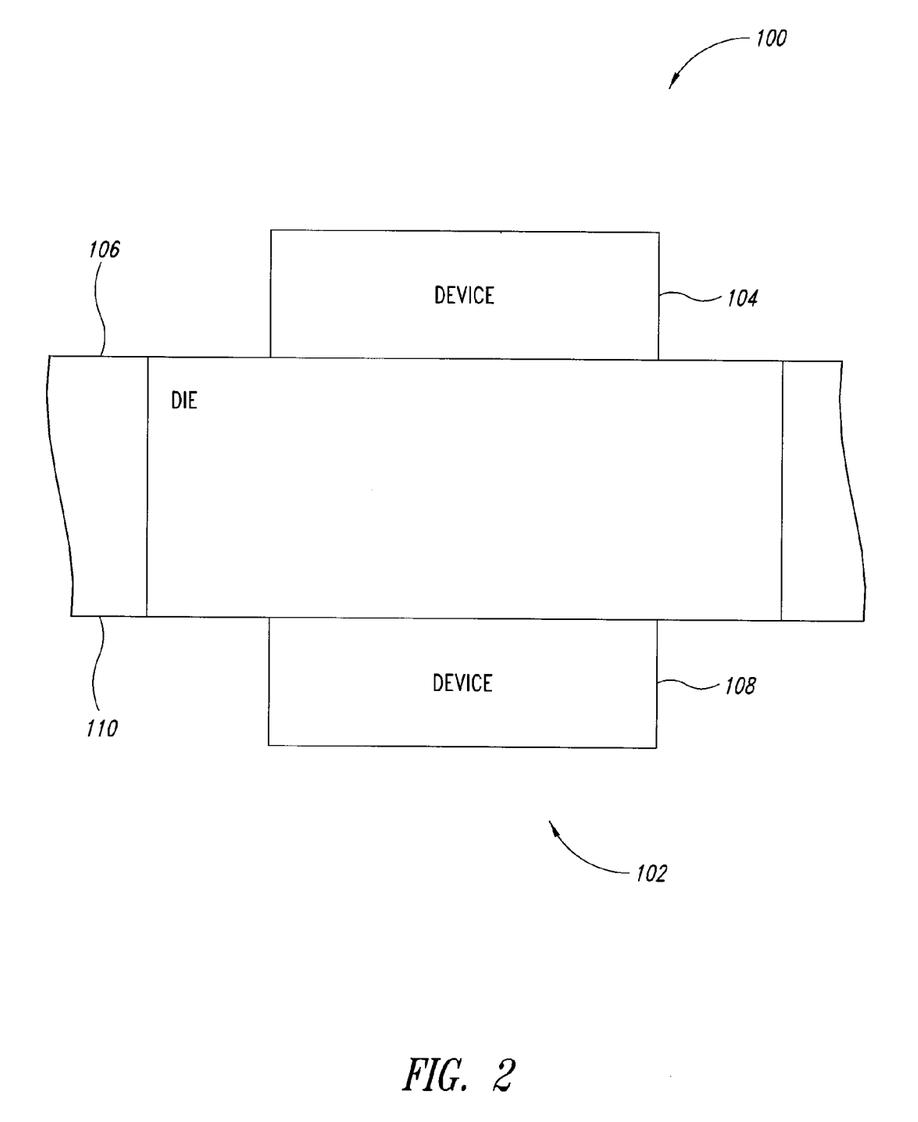
FIG. 2 is an expanded side cross-sectional view of an embodiment of a wafer.

FIGS. 1 and 2 show various views of an embodiment of a wafer 100. FIG. 1 is a top view of the wafer 100. Embodiments of a wafer, like the wafer 100, may have anywhere from one die 102 to many thousands of die 102. As illustrated, the wafer 100 has a plurality of die 102. FIG. 2 is an expanded side cross-sectional view of the wafer 100 to illustrate features of an embodiment of a die 102 of the wafer 100. The die 102 has at least one first device 104, such as a transistor, a MEMs device, a NEMs device, an integrated circuit, an optical device, etc., formed on a first surface 106 of the wafer 100, and at least one second device 108, such as a transistor, a MEMs device, a NEMs device, an integrated circuit, an optical device, etc, formed on a second surface 110 of the wafer 100. The plurality of die 102 of the wafer 100 may have identical first devices 104, or may have varying first devices 104. Similarly, the plurality of die 102 of the wafer 100 may have identical second devices 108, or may have varying second devices 108. Various combinations of devices may be employed. For example, in various embodiments the at least one first device 104 may comprise an integrated circuit and the at least one second device 108 may comprise a different integrated circuit; the at least one first device 104 may comprise an integrated circuit and the at least one second device 108 may comprise a MEMs device, such as a BioMEMs, an RFMEMs, etc.; the at least one first device 104 may comprise an integrated circuit and the at least one second device 108 may comprise an optical device; the at least one first device 104 may comprise an integrated circuit and the at least one second device 108 may comprise fiber optics; the at least one first device 104 may comprise an integrated circuit and the at least one second device 108 may comprise an antenna; etc.

Manufacturers may utilize existing semiconductor processing equipment, for example, to form the wafer 100. For example, existing 6 inch wafer equipment, which may in many instances have already been fully depreciated, may be employed in some embodiments. Sacrificial materials, protective plates, etc., may be employed to cushion or otherwise protect one side of the wafer while one or more processing methods are performed on the other side of the wafer 100 to form a device. For example, a photo resist may be applied to one side while processing occurs on the other side. Many processing steps may be shared in some embodiments, such as forming silicon dioxide, forming silicon nitride, plating, cleaning steps, dicing, packaging, etc. Sometimes processes may be shared during manufacture and sometimes processes may be performed separately. The devices and the order of processing steps may be selected so as to facilitate forming devices on both sides of the die. For example, high temperature, high pressure, etc., processes used to form, for example, an integrated circuit, etc., on one side of the die may be performed before low temperature, low pressure, etc., processes used to form, for example, a MEMs device, an optical switch, etc., on the other side of a wafer. The devices may be intended to work together. For example, a system comprising an integrated circuit and a MEMs device may be formed by forming the integrated circuit on one side of a die of a wafer and the MEMs device on the other side of the die of the wafer and cutting the wafer to form the die. The MEMs device and the integrated circuit may be coupled together through, for example, vias or bonding wires, etc. Embodiments of die with semiconductor devices on both sides may be packaged in various ways, including using techniques such as ball grid arrays, flip chips, stacked, wire bonding, etc., and combinations thereof.

Figure 3:
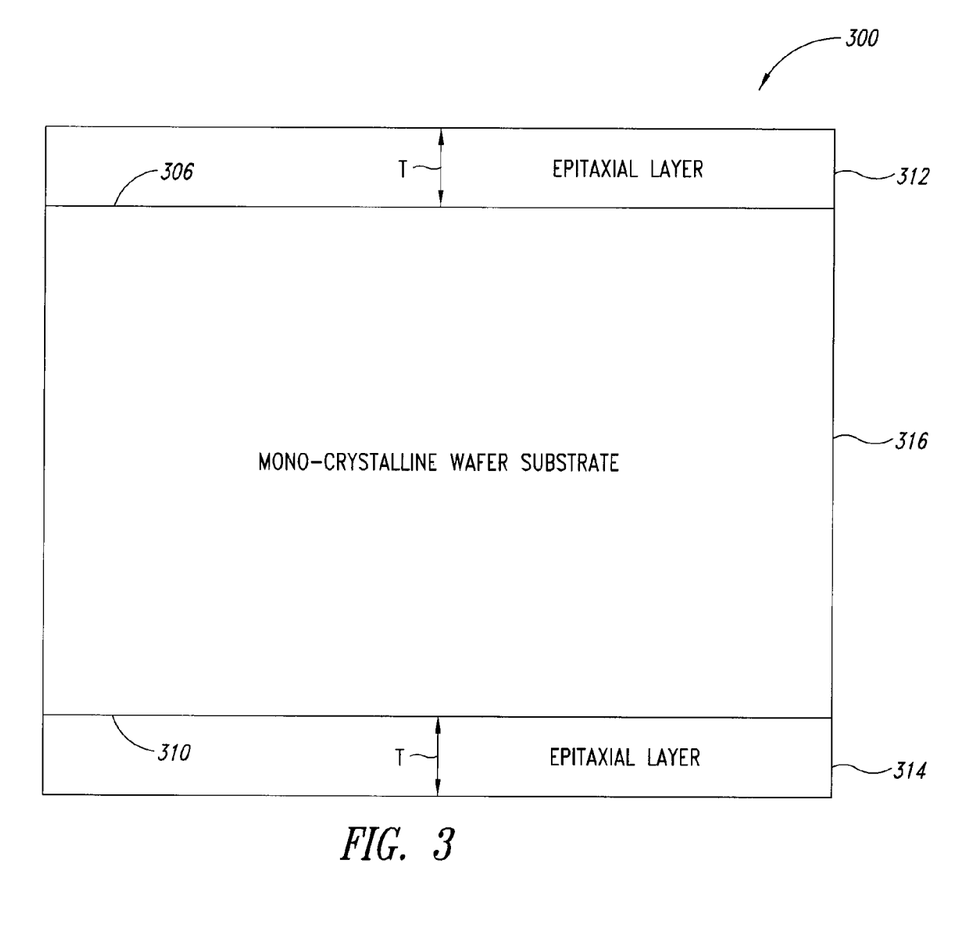
FIG. 3 is an expanded side cross-sectional view of an embodiment of a wafer during a manufacturing process.
Figure 4:
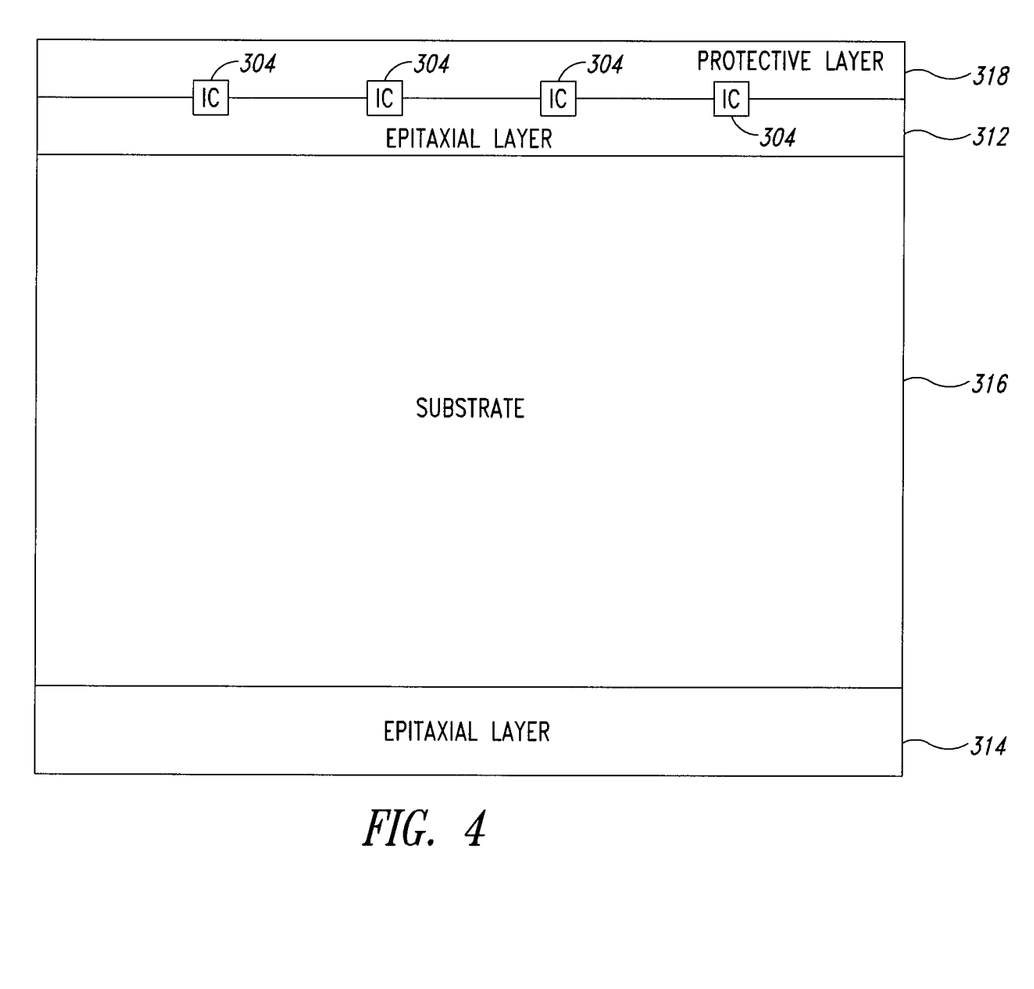
FIG. 4 is an expanded side cross-sectional view of an embodiment of a wafer during a manufacturing process.
Figure 5:
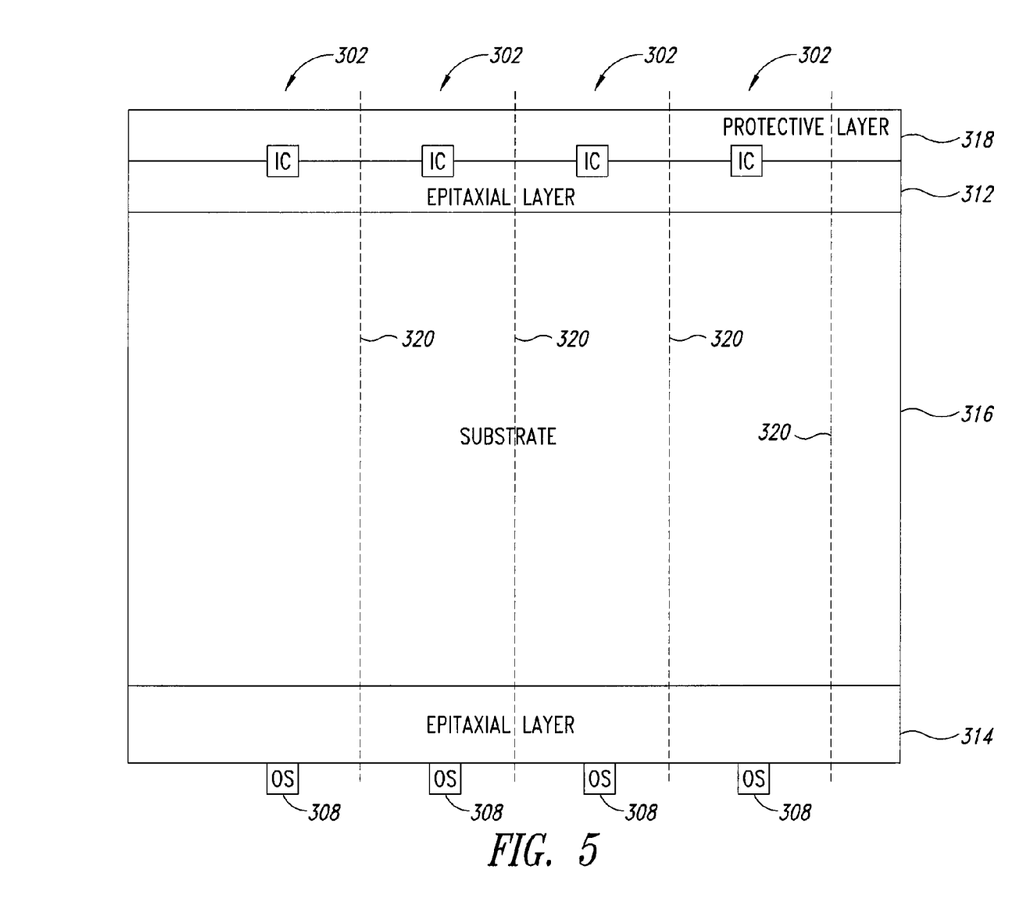
FIG. 5 is an expanded side cross-sectional view of an embodiment of a wafer during a manufacturing process.

FIGS. 3 through 5 are expanded side cross-sectional views of various embodiments of a wafer 300 during various stages of manufacturing processes. In FIG. 3 a first dielectric layer, which as illustrated is a first epitaxial layer 312, for example of silicon dioxide, etc., is formed (i.e., grown, deposited or positioned) on a first surface 306 and a second dielectric layer, which as illustrated is a second epitaxial layer 314, for example of silicon dioxide, etc., is formed (i.e., grown, deposited or positioned) on a second surface 310 of a substrate 316, as illustrated a mono-crystalline silicon wafer 316. The first epitaxial layer 312 and the second epitaxial layer 314 may be of a similar quality and thickness or may be of different qualities and thicknesses T, and may be formed at the same time, or in separate processes. For example, the substrate 316 may be suspended in a chamber and silicon dioxide formed on both the first surface 306 and the second surface 310 of the substrate 316. The substrate 316 may have a thickness on the order of, for example, several hundred microns, while the first and second epitaxial layers 312, 314 may have thicknesses on the order of, for example, 2-20 microns. As discussed in more detail below, the thicknesses of one or more of the epitaxial layers may be determined to facilitate subsequent processing. For example, a thickness of the second epitaxial layer 314 on the second surface 310 of the substrate 316 may be selected so as to facilitate removal of a portion of the second epitaxial layer 314 after at least one device (see integrated circuits 304 in FIG. 4) is formed on the first epitaxial layer 312.

FIG. 4 shows a plurality of devices 304 formed on and/or in the first epitaxial layer 312 of the wafer 300 of FIG. 3. As illustrated, the devices are integrated circuits. The integrated circuits 304 may be formed of, for example, a high-quality silicon and using, for example, high-temperature processes. As illustrated, the integrated circuits 304 are formed partially in and partially on the first epitaxial layer 312. An optional protective layer 318 is positioned or formed on the integrated circuits 304 after the integrated circuits are formed. For example, a sacrificial layer of silicon dioxide, a layer of photo-resist, etc. may be applied.

FIG. 5 shows the embodiment of a wafer 300 of FIG. 4 after a portion of the second epitaxial layer 314 is removed and a plurality of devices 308. are formed on the second epitaxial layer 314. As illustrated, the plurality of devices 308 are optical switches. The optical switches 308 may be formed, for example, in low quality silicon using low temperature processes. Thus, damage to the second epitaxial layer 314 caused during the formation of the integrated circuits 304 may be of little or no significance, and additional conditioning of the second epitaxial layer may not be necessary. In addition, low temperature and pressure processes used to form the optical switches 308 may be unlikely to damage the integrated circuits 304. The optional protective layer 318 may be removed after the optical switches 308 are formed, and the wafer may be cut into die 302, for example along dashed lines 320 in FIG. 5.

Figure 6:
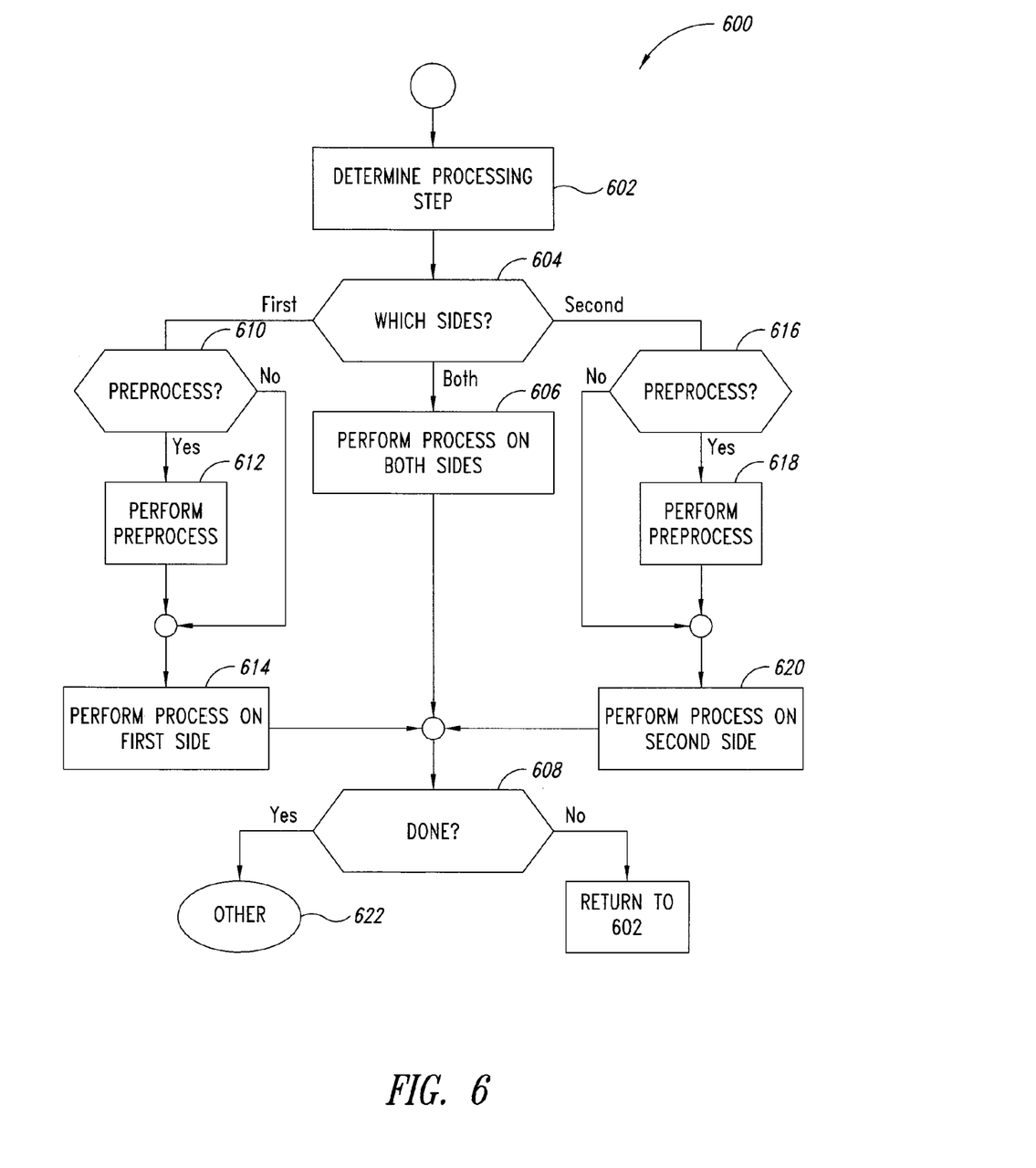
FIG. 6 illustrates an embodiment of a method of manufacturing a double-sided wafer.

FIG. 6 illustrates an embodiment of a method 600 of manufacturing a double-sided wafer, such as the wafers 100, 300 of FIGS. 1-5. For convenience, the process will be described with reference to the wafer 100 of FIGS. 1 and 2. At act 602, a processing step is determined to modify at least one physical characteristic of at least one side of the wafer. For example, forming an epitaxial layer, applying a photo-resist, etching, plating, doping, forming one or more layers or regions of a material, cleaning, dicing, etc. The method 600 proceeds from act 602 to act 604. At act 604, it is determined whether the determined processing step should be applied to only the first side 106, only the second side 110 or to both sides 106, 110 of the wafer 100.

When it is determined that the determined processing step should be applied to both sides, the method 600 proceeds from act 604 to act 606, where the determined processing step is performed on both sides 106, 110 of the wafer 100. The method proceeds from act 606 to act 608.

When it is determined that the determined processing step should be applied only to the first side 106 of the wafer 100, the method proceeds from act 604 to act 610, where it is determined whether preprocessing is desired. For example, it may be determined that it is desirable to apply a protective layer to the second side 110 of the wafer 100 before performing the determined processing step on the first side 106 of the wafer 100.

When it is determined at act 610 that preprocessing is desired, the method 600 proceeds from act 610 to act 612, where the desired preprocessing is performed. The method 600 proceeds from act 612 to act 614, where the determined processing step is performed on the first side 106 of the wafer 100. When it is determined at act 610 that preprocessing is not desired, the method proceeds from act 610 to act 614, where the determined processing step is performed on the first side 106 of the wafer 100. The method 600 proceeds from act 614 to act 608.

When it is determined that the determined processing step should be applied only to the second side 110 of the wafer 100, the method proceeds from act 604 to act 616, where it is determined whether preprocessing is desired. For example, it may be determined that it is desirable to apply a protective layer to the first side 106 of the wafer 100 before performing the determined processing step on the second side 110 of the wafer 100.

When it is determined at act 616 that preprocessing is desired, the method 600 proceeds from act 616 to act 618, where the desired preprocessing is performed. The method 600 proceeds from act 618 to act 620, where the determined processing step is performed on the second side 110 of the wafer 100. When it is determined at act 616 that preprocessing is not desired, the method proceeds from act 616 to act 620, where the determined processing step is performed on the second side 110 of the wafer 100. The method 600 proceeds from act 620 to act 608.

At act 608, it is determined whether wafer-level processing is finished. When it is determined at act 608 that wafer-level processing is not finished, the method 600 returns to act 602. When it is determined at act 608 that wafer-level processing is finished, the method 600 proceeds from act 608 to act 622, where other processing, such as, for example, packaging of die cut from the wafer, may occur.

Embodiments of methods of forming double-sided wafers may perform additional acts not shown in FIG. 6, may perform acts shown in FIG. 6 in various orders, and may not perform all of the acts shown in FIG. 6.

Some embodiments may take the form of or comprise computer program products. For example, according to one embodiment there is provided a computer readable medium comprising a computer program adapted to perform one or more of the methods or functions described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof. For example, embodiments of the method of FIG. 6 may be implemented as discussed above to control machinery, equipment and processes used to manufacture wafers with devices on both sides.

The concepts of this disclosure may be applied to embodiments of Micro-ElectroMechanical Systems (MEMS), which refers to microscopic mechanical devices, such as sensors, actuators, and electronics, typically fabricated on or in silicon chips or a silicon substrate using micro-fabrication technology. For example, a MEMS device may comprise a first suspended electrode and a second electrode separated by a submicron opening. MEMS devices may generally comprise moveable components such as mechanical components and may, for example, range in size from a micrometer (a millionth of a meter) to a millimeter (a thousandth of a meter), and can include three-dimensional lithographic features employing various geometries. MEMS devices include, for example, BioMEMS, RFMEMS, Opto-MEMS, etc.

Typical applications for MEMS devices and systems include piezoelectrics for printers or bubble ejection of ink, accelerometers to control the deployment of airbags, gyroscopes for dynamic stability control, pressure sensors used in transportation and medical applications, such as car tire pressure sensors and disposable blood pressure sensors, micromirrors used to form displays, optical switching technology for data communications, heated chambers for fluidic applications, etc.

A related technology to which the concepts of this disclosure may be applied is Nano-ElectroMechanical Systems (NEMS), which are similar to MEMS but on a smaller scale, including displacements and forces at the molecular and atomic scales. MEMS, NEMS and nanotechnology facilitate providing mechanical and electrical devices on, for example, a single chip, that may be much smaller, more functional and reliable, and produced at a fraction of the cost of conventional macroscale elements.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    forming a plurality of semiconductor devices on a first side of a wafer, the forming of the plurality of semiconductor devices including:
        growing a first epitaxial layer on the first side of the wafer; and
        forming the plurality of semiconductor devices in the first epitaxial layer;
    forming a plurality of optical components on a second side of the wafer opposite of the first side of the wafer, the forming of the plurality of optical components including:
        forming a second epitaxial layer on the second side of the wafer; and
        forming the plurality of optical components in the second epitaxial layer; and
    separating the wafer into a plurality of die, each die having at least one of the plurality of semiconductor devices on a first side of the die and at least one of the plurality of optical components on a second side of the die, opposite of the first side of the die.

2. The method of claim 1, further comprising forming a plurality of micro-electromechanical devices on the second side of the wafer.

3. The method of claim 2, further comprising electrically coupling a semiconductor device of the plurality of semiconductor devices to a micro-electromechanical device of the plurality of micro-electromechanical devices.

4. The method of claim 1, wherein the forming the plurality of semiconductor devices and the forming the plurality of optical components further includes performing at least one process simultaneously on the first and second sides of the wafer.

5. The method of claim 1, wherein the forming the plurality of optical components further includes forming a protective layer on the first side of the wafer.

6. The method of claim 1, wherein the forming the plurality of optical components further includes etching the second side of the wafer after performing at least one process on the first side of the wafer.

7. The method of claim 1, wherein the forming the plurality of optical components further includes securing the second side of the wafer to a plate before performing a process on the first side of the wafer.

8. The method of claim 1, further comprising forming a plurality of optical switches on the second side of the wafer, and electrically coupling a semiconductor device of the plurality of semiconductor devices to an optical switch of the plurality of optical switches.

9. The method of claim 1, wherein the forming the plurality of semiconductor devices on the first side of the wafer includes performing at least one high-temperature process, and the forming the plurality of optical components is limited to performing low temperature processes.

10. A semiconductor die, comprising:
a semiconductor substrate having a first side and a second side opposite of the first side;
a first epitaxial layer grown on the first side of the semiconductor substrate;
a second epitaxial layer grown on the second side of the semiconductor substrate;
a first semiconductor device formed in the first epitaxial layer on the first side of the semiconductor substrate; and
an optical component electrically coupled to the first semiconductor device, the optical component formed in the second epitaxial layer on the second side of the semiconductor substrate.

11. The semiconductor die of claim 10, further comprising a second semiconductor device on the second side of the substrate.

12. The semiconductor die of claim 11, wherein the first semiconductor device is electrically coupled to the second semiconductor device.

13. The semiconductor die of claim 10, further comprising a micro-electromechanical device electrically coupled to the first semiconductor device, the micro-electromechanical device formed on the second side of the semiconductor substrate.

14. A system, comprising:
a circuit board; and
a semiconductor die electrically coupled to the circuit board and including:
a semiconductor substrate having a first side and a second side opposite of the first side;
a first epitaxial layer grown on the first side of the semiconductor substrate;
a second epitaxial layer grown on the second side of the semiconductor substrate;
a first semiconductor device formed in the first dielectric layer on the first side of the semiconductor substrate; and
an optical component electrically coupled to the first semiconductor device, the optical component formed in the second epitaxial layer on the second side of the semiconductor substrate.

15. The system of claim 14, further comprising a micro-electromechanical device electrically coupled to the first semiconductor device, the micro-electromechanical device formed on the second side of the semiconductor substrate.

16. The system of claim 14, wherein the semiconductor die includes a second semiconductor device formed on the second side of the substrate.

17. A method, comprising:
growing a first epitaxial layer on a first side of a semiconductor wafer;
forming at least one integrated circuit in the first epitaxial layer the forming the at least one integrated circuit including: applying a first plurality of processes to the first side of the semiconductor wafer, the first plurality of processes including at least one high-temperature process;
forming at least one optical component on a second side of the wafer opposite the first side of the wafer, the forming the at least one optical interface including:
growing a second epitaxial layer on the second side of the wafer;
forming the at least one optical interface on the second epitaxial layer; and
forming the at least one optical interface by using a lower-temperature process than the high-temperature process.

18. The method of claim 17, wherein the forming the at least one integrated circuit and the forming the at least one optical component includes performing at least one process simultaneously to both sides of the semiconductor substrate.

19. The method of claim 17, wherein the first plurality of processes includes at least one process on the first side of the semiconductor substrate to compensate for the forming of the component.

20. The method of claim 17, wherein the first plurality of processes includes at least one process on the first side of the semiconductor substrate selected from a group of processes including: growing material; depositing material; removing material; cleaning; drying; and cutting.

21. The method of claim 17, wherein the first plurality of processes includes at least one plating process on the first side of the semiconductor substrate.

* * * * *